United States Patent [19]

Adams

[11] 4,331,931
[45] May 25, 1982

[54] GAIN CONTROL SYSTEMS
[75] Inventor: Robert W. Adams, Medford, Mass.
[73] Assignee: DBX, Inc., Newton, Mass.
[21] Appl. No.: 131,225
[22] Filed: Mar. 17, 1980

Related U.S. Application Data

[63] Continuation of Ser. No. 90,328, Nov. 1, 1979, abandoned.
[51] Int. Cl.³ .......................... H03F 3/18; G06G 7/12
[52] U.S. Cl. .................................. 330/278; 328/145; 307/492; 307/493
[58] Field of Search .................. 307/492, 493, 500; 328/143, 145; 330/146, 263, 267, 278, 285

[56] References Cited

U.S. PATENT DOCUMENTS 4,182,993  1/1980  Tyler .................................. 330/279
4,225,794  9/1980  Buff .................................... 328/145

Primary Examiner—James B. Mullins
Assistant Examiner—Gene Wan
Attorney, Agent, or Firm—Schiller & Pandiscio

[57] ABSTRACT

Amplification means responsive to an input signal of a gain control circuit is utilized in each log-antilog transmission path of the gain control circuit so as to provide in each path signal gain as a function of said input signal.

10 Claims, 1 Drawing Figure

U.S. Patent
May 25, 1982
4,331,931
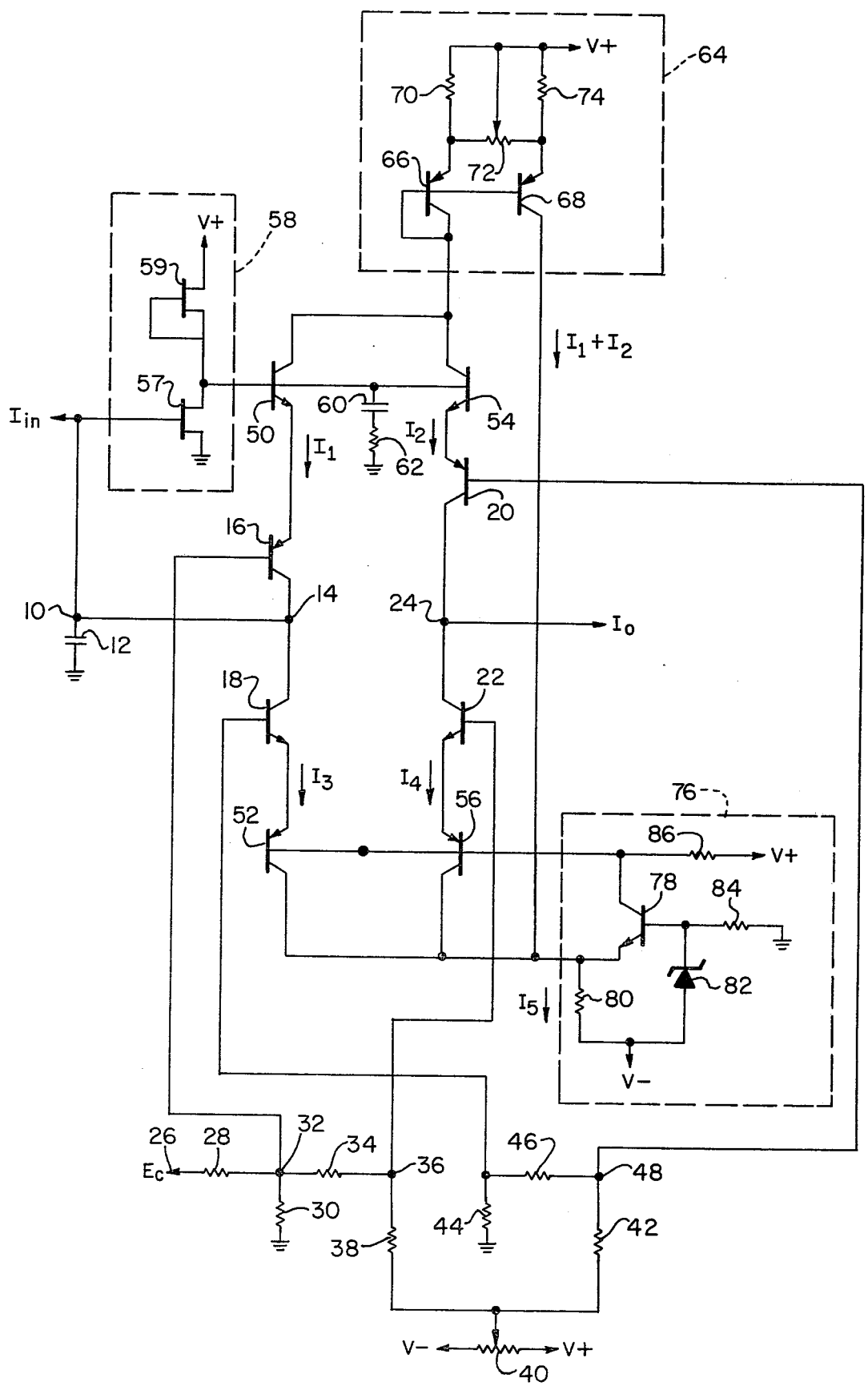

GAIN CONTROL SYSTEMS

RELATED APPLICATION

This application is a continuation of application Ser. No. 90,328 filed Nov. 1, 1979, now abandoned.

This invention relates to electronic multipliers or gain control circuits, and more particularly to analog multipliers with logarithmic control responses.

Many systems, especially those used for audio and video signals, include signal gain circuits controlled in response to an electrical command or gain control signal. One such gain control circuit, also referred to as a "voltage control amplifier" or "VCA", is described and claimed in U.S. Pat. No. 3,714,462 issued to David E. Blackmer on Jan. 30, 1973 (the claimed circuits hereinafter being collectively referred to as the "Blackmer circuit"). The Blackmer circuit has been commercially successful, particularly for use in audio noise reduction systems, commonly referred to as "companders".

The Blackmer circuit is an analog device providing a logarithmic control response. The circuit generally includes first signal converting means for providing a first signal which is logarithmically related to the input signal, and second signal converting means. The latter is connected to the first signal converting means so as to provide an output signal which is an anti-logarithmic function of the sum of the first signal and the gain control signal. More specifically, the Blackmer circuit comprises an input operational amplifier having a pair of feedback paths, one being conductive when the input signal is of a positive polarity, the other being conductive when the input signal is of a negative polarity. In the preferred form of the Blackmer circuit, each feedback path includes a log device for converting the input signal of the correct polarity into a log form. Each log device in each path has connected to it an antilog device for converting the log signal together with the gain control signal into an antilog form. For want of a better expression the signal path defined by each log device and the corresponding antilog device to which the log device is coupled shall hereinafter be referred to as the "log-antilog transmission path". The log devices are preferably collector-emitter circuits of transistors of opposite conductivity types, i.e. PNP and NPN transistors, since such circuits exhibit log-linear transfer characteristics. Similarly, the antilog devices are typically emitter-collector circuits of transistors of opposite conductivity types, since such circuits exhibit antilog-linear transfer characteristics. A control signal is summed with the log signal of each path by applying the voltage to the bases of the log and the antilog transistors, thereby controlling the gain of the circuit.

Although the Blackmer circuit, employing the four transistors as log and antilog devices (hereinafter referred to for convenience as the "primary" transistors) theoretically provides substantially zero distortion, as a practical matter commercially available transistors are not perfect. Thus, the output of the circuit may include some detectable distortion, although in the case of audio applications, it may not be readily discernable to the average listener. This distortion can be attributed, at least in part, to two inherent characteristics of the primary transistors: (1) each transistor has a finite current gain and (2) each transistor exhibits an inherent nonzero or parasitic base resistance. As a result of finite gain, when any base current is provided through the base of the transistor a base voltage error results and a distortion component will be generated due to the voltage drop across the parasitic base resistance. Where the log converting and antilog converting transistors of each signal path are matched, at unity gain the distortion contributed by the log and antilog transistors of each signal path are equal and opposite and will cancel one another. However, as the gain shifts from unity gain, and the amount of signal in the log converting transistors differs from that in the anti-log converting transistors and the distortions are not equal and thus will not cancel each other.

This distortion component typically will show up in standard SMPTE IM (intermodulation) distortion tests. The error voltage at the bases of these devices can be thought of as another control voltage signal which varies the gain of the circuit as the signal is changing, so that as the gain shifts from unity gain the amount of distortion tends to increase.

Various techniques have been proposed to correct for this distortion. One suggested technique now being commercially exploited, incorporates into the emitter path of each primary transistor of the Blackmer circuit a diode element so as to form four compound log and antilog devices. For convenience this circuit shall be referred to hereinafter as the "four-transistor, four-diode cell VCA". More particularly, to form the four-transistor, four-diode cell VCA, the emitter of each primary transistor of the Blackmer circuit is connected to a secondary transistor, the latter being connected so as to operate in a diode mode. The secondary diode-connected transistors are of an opposite conductivity as the corresponding primary transistors to which they are connected so that the emitters of the log and antilog NPN primary transistors of one log-antilog transmission path are connected to the corresponding emitters of the PNP secondary diode-connected transistors, and the emitters of the log and antilog PNP primary transistors of the other log-antilog transmission path are connected to the corresponding emitters of NPN secondary diode-connected transistors. The PNP secondary diode-connected transistors are connected with their bases and collectors tied together and to a first current source. The NPN secondary diode-connected transistors are connected with their bases and collectors tied together and to a second current source. The first and second current sources are connected to receive the output of an operational amplifier of the circuit, the inverting input of which receives the current signal input of the circuit and the positive input of which is connected to ground. As the input signal current varies the relative magnitude of the current provided by one current source to the pair of secondary diode-connected transistors to which it is connected varies with respect to the magnitude of the current provided by the other current source connected to the other pair of secondary diode-connected transistors such that the sum of the currents provided by the current sources to the secondary diode-connected transistors always remains substantially constant.

The quiescent biasing currents provided by the current sources through the respective diode transistors to the emitters of the corresponding primary transistors are set such that they are at least twice the expected maximum input signal current to the circuit so that all the primary transistors will be continuously conducting and will not turn off regardless of the polarity of the input signal. Thus, one log-antilog transmission path is transmissive for one representation of the input electrical signal (i.e., when the amplitude level of the input current exceeds the level of the quiescent current) and the other log-antilog transmission path is transmissive for an inverted representation of the input electrical signal (i.e., when the amplitude level of the input current is below the level of the quiescent current). This results in a Class A push-pull device which has the advantage over the Blackmer circuit in that distortion due to the base resistances of the primary transistors will be substantially reduced due to the fact that the two current sources are controlled out of phase with one another (their sum is constant). Therefore, errors introduced by one set of base resistances of the primary transistors of one log-antilog transmission path are cancelled by complementary errors in the corresponding set of base resistances of the secondary transistors of the same transmission path. Complementarity is assured by the connection of a diode-connected transistor of one polarity to a primary transistor of the opposite polarity. Therefore, the errors introduced by finite base resistances are equal in all compound log elements, i.e., the combined primary log transistor and the secondary diode-connected transistor. Thus, allowing distortion cancellation to occur the contributing error introduced near quiescent conditions will be substantially reduced. Further, by operating as a Class A device, distortion will not be dependent upon temperature.

Although, the above-described compensation scheme of creating a Class A push-pull device in the four-transistor, four-diode cell VCA reduces I.M. distortion, the bandwidth has been found to be limited such that the resulting circuit has a relatively narrow bandwidth. By way of example, the resulting gain bandwidth product has been found to be limited to about three megahertz. The reason for the relatively narrow bandwidth of the resulting four-transistor, four-diode cell VCA is in part largely due to the fact that all of the gain of the circuit is provided by the input operational amplifier. More particularly, a current input and the resulting current output of the VCA draws current from one of the current sources through the secondary diodes and primary transistors of the corresponding log-antilog transmission path. The log and antilog components in each of the log-antilog transmission paths of the four transistor, four diode cell VCA determine the gain ratio of the output to input, with the ratio being dependent upon the level of the gain control signal applied. It is the product of the gain of the operational amplifier and the gain ratio which provides the overall signal gain of the system. Since the primary transistors provide no signal gain and the secondary diodes merely conduct current responsively to the input and output currents, no signal gain is provided in the log-antilog transmission paths of this VCA. Since all of the gain is provided by the input operational amplifier there are relatively strict requirements placed on that amplifier. A consequence of these requirements is that the overall gain bandwidth product of the input amplifier and thus the gain bandwidth product of the four transistor, four diode cell VCA is relatively low.

It is therefore a general object of the present invention to provide an improved analog multiplier circuit of the type having a logarithmic control response, which circuit substantially reduces or overcomes the above-noted problems of the prior art.

More specifically, an object of the present invention is to provide an improved analog multiplier circuit having a greater gain bandwidth product than that of the above-noted prior art.

Another object of the present invention is to provide an improved analog multiplier circuit of the type including an input operational amplifier and having a logarithmic control response, wherein the requirements of the input operational amplifier are reduced.

And another object of the present invention is to provide an improved analog multiplier circuit of the type including an input operational amplifier and a log-antilog transmission path for each representation of the input signal, wherein signal gain is provided in each of the transmission paths so as to reduce the requirements of the input operational amplifier.

Still another object of the present invention is to provide an improved analog multiplier circuit including an input operational amplifier and a log-antilog transmission path for each representation of the input signal, wherein signal gain, is provided in each transmission path responsively to and as a function of the input signal.

Yet another object of the present invention is to provide an improved analog multiplier which in its preferred form is operable as a Class A device with a reduction from the component count used in the prior art four transistor, four diode cell VCA.

These and other objects of the present invention are achieved by a gain control circuit of the type including log-antilog transmission paths for each representation of the input signal and comprising amplification means disposed in each transmission path for providing in each path a signal gain responsively to and as a function of the input signal. In its preferred embodiment the circuit is designed for Class A operation.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawing wherein:

The FIGURE is a schematic circuit diagram of the preferred embodiment of the present invention.

In the FIGURE, the input signal is applied to current input terminal generally designated at 10. Terminal 10 is connected to one plate of capacitor 12 (the opposite plate of which is connected to system ground) and to the input 14 to the two transmission paths of the analog multiplier circuit. Input 14 is formed at the junction of the two collectors of the primary log transistors 16 and 18, the first being a PNP transistor while the latter being an NPN transistor. The collectors of the primary antilog transistors 20 and 22 are joined at junction 24 so as to form the current output 24 of the multiplier circuit. The gain control signal Ec is applied to the control signal input terminal 26. The latter is connected through resistor 28 and resistor 30 to ground. The junction 32 of resistors 28 and 30 is connected to the base of one of the primary log transistors, with connection being shown to the base of transistor 16. Junction 32 is also connected to resistor 34, which in turn is connected to the primary antilog transistor of the path opposite to the path containing the log transistor to which junction 32 is attached. As illustrated, the connection is made to the base of antilog transistor 22.

In addition, in order to provide symmetry among the primary transistors 16, 18, 20 and 22, the junction 36 between resistor 34 and the base of transistor 22 is connected through resistor 38 to the tap of variable voltage source 40, the base of transistor 20 is connected through resistor 42 to the tap of source 40, transistor 18 is connected to the junction of resistors 44 and 46 with the former being connected to ground and the latter being connected to the junction 48 of the base of transistor 20 and resistor 42. As is well known, adjustment of source 40 provides the desired symmetry of the primary transistors.

To the extent described, the emitters of transistors 16 and 20 and the emitters of transistors 18 and 22 would be coupled together to form the Blackmer circuit. However, in accordance with the present invention the Blackmer circuit is modified such that amplification means, in the preferred form of secondary transistors 50, 52, 54 and 56 are each connected to a corresponding emitter of the primary transistor and connected within the circuit so as to provide signal gain in each log-antilog transmission path. By providing signal gain in each log-antilog transmission path, the required amount of gain which must be provided by the input amplifier, shown generally at 58, is reduced. This in turn reduces the requirements of amplifier 58 so as to enable an amplifier with a greater bandwidth response to be utilized. Thus, the resulting device has a greater gain bandwidth product than that achieved the the prior art four-transistor, four diode cell VCA previously described.

More particularly, in the preferred form of the invention, the emitter of each primary transistor 16, 18, 20 and 22 is connected to the emitter of the respective secondary transistor 50, 52, 54 and 56 with each secondary transistor being of a conductivity type opposite to that of the primary transistor to which it is paired. This results in what is hereinafter referred to as an "eight transistor gain cell VCA". The bases of the secondary transistors 50 and 54 of one transmission path are tied together, connected to system ground through capacitor 60 and series resistor 62, and connected to the output of operational amplifier 58. Amplifier 58 has its signal input terminal connected to terminal 10 so as to receive the signal input current. Amplifier 58 includes two FET transistors 57 and 59. The source terminal of transistor 59 is connected to a positive voltage potential while the gate and drain terminals are connected to the base of the secondary transistor 50. The base of transistor 50 is in turn connected to the source terminal of transistor 57 with its gate terminal forming the input terminal of the amplifier and its drain terminal connected to ground. In the absence of an input signal to amplifier 58, the voltage level on the base of transistor 50 will be at a level such that transistors 50 and 16 will conduct current so as to make the voltage signal input at terminal 10 equal to zero. Where the current input at terminal 10 increases to provide one representation of the input signal, the transistor 57 will become more conductive and the potential level on the base of transistor 50 will drop proportionally to the level of the applied current so that the collector current thereby generated in each secondary transistor 50 and 54 will be a function of the voltage level output of amplifier 58 and the current-to-current amplification factor introduced by each secondary transistor 50 and 54. Conversely, where the current input at terminal 10 decreases to provide the other representation of the input signal, the transistor 57 will become less conductive and the potential level on the base of transistor 50 will increase proportionally to the level of the applied current. The collectors of the secondary transistors 50 and 54 are preferably connected together and to a low impedance current source, preferably in the form of current mirror 64 so as to provide the necessary quiescent current in order to achieve Class A operation. Current mirror 64 is of a type well known in the art and generally includes a first transistor 66 having its base and collector tied together, tied to the collectors of secondary transistors 50 and 54 and tied to the base of a second transistor 68. The emitter of transistor 66 is connected through resistor 70 to both a positive DC voltage potential source and one end of potentiometer 72. Similarly, the emitter of transistor 68 is connected through resistor 74 to both the positive DC voltage potential source and the other end of potentiometer 72. The tap of potentiometer 72 is adjusted so that the collector current of transistor 66 always equals the collector current of transistor 68.

In order to provide Class A behavior in the preferred embodiment, the sum of the biasing currents through the emitters of the primary transistors must remain substantially constant and the quiescent levels must be at least twice the maximum expected levels in response to the maximum input level. More particularly, the collector of the transistor 68 of the current mirror 64 is connected, with the collectors of secondary transistors 52 and 56 to the input of a differential current gain stage 76. The latter is of a type well known in the art.

The input of stage 76 is connected to the emitter of transistor 78 and through resistor 80 to both a negative DC voltage potential source and to the anode of Zener diode 82. The cathode of diode 82 is in turn connected to the base of transistor 78 and through resistor 84 to system ground. The collector of transistor 78, which forms the output of stage 76, is biased by connecting the collector through resistor 86 to a positive DC voltage potential, and is connected to the bases of secondary transistors 52 and 56.

In operation, when a current input is applied to terminal 10 and a DC control signal is applied to control terminal 26, a voltage is also applied to the bases of secondary transistors 50 and 54. The voltage level applied to the bases decreases linearly with an increasing current input to terminal 10.

The emitter current $I_1$ of transistors 50 and 16 and the emitter current $I_2$ of transistors 54 and 20 increase with an increasing voltage output of amplifier 58, and have the following relationship:

$$(I_2/I_1) = eK(V_{16} - V_{20}) \quad (1)$$

wherein:
e is the symbol for an exponential function;
K is a constant;
$V_{16}$ is the base voltage applied to the transistor 16; and
$V_{20}$ is the base voltage applied to transistor 20.

The above equation illustrates the desired gain changing action of the circuit.

The nature of current mirror 64 is such that the collector current of transistor 68 is always equal to the collector current of transistor 66, (the latter current equaling the sum of the collector currents of transistors 50 and 54 and thus approximately equaling the sum of the emitter currents of transistors 50 and 54). Accordingly, the collector current of transistor 68 approximately equals $I_1+I_2$. The collector current of transistor 68 is applied to the input of stage 76. The nature of stage 76 is such that the current through resistor 80 (identified as $I_5$) remains substantially constant regardless of the collector current of transistor 68. As a result an increase in the collector current produces a decrease in the conduction of current through transistor 78. This in turn produces a reduction in the voltage applied to transistors 52 and 56 causing a reduction in the respective emitter currents $I_3$ and $I_4$ of transistors 18 and 52 and transistors 22 and 56.

This can be visualized in another way. By treating the input of stage 76 as a common node, the current out of the node, i.e., $I_5$ (which remains constant) is equal to the sum of the currents into the node, i.e., the collector currents of transistors 52 and 56 which approximate $I_3+I_4$, the collector current of transistor 68 which approximates $I_1+I_2$ and the collector emitter current of transistor 78 drawn through resistor 86. By making the latter a relatively large resistor so that the current drawn through the resistor is negligible, the condition that the sum of the currents $I_1$, $I_2$, $I_3$ and $I_4$ is always constant will for all practical purposes be satisfied. Thus, when the input current is above the operating level of the transistor 59 (typically around $-2$ or $-3$ volts), an increase in the input current of terminal 10, reduces the voltage applied to the bases of transistors 50 and 54, thereby reducing $I_1$ and $I_2$. This provides a corresponding reduction in the collector current of transistor 68 and a corresponding increase in the base voltage of transistors 52 and 56 and an increase in the emitter and collector currents of transistors 52 and 56 so that $I_5$ remains substantially constant. Conversely, a decrease in the input current at terminal 10, increases the voltage applied to the bases of transistors 50 and 54, thereby increasing $I_1$ and $I_2$. This provides a corresponding increase in the collector current of transistor 68 and a corresponding decrease in the emitter and collector currents of transistor 52 and 56 so that again $I_5$ remains substantially constant.

The above-described electrical gain control system provides an advantage over the prior art four-transistor, four diode cell VCA since the voltage-to-current amplication conversion provided by the secondary transistors 50, 52, 54 and 56 provides signal gain in the log-antilog transmission paths of the system, reducing the required signal gain which otherwise would be required of the input operational amplifier 58. Reducing the required gain introduced by amplifier 58 increases both gain and bandwidth of the entire circuit such that the gainbandwidth product has been measured to be approximately fifty megahertz, well in excess of the product of three megahertz provided by the prior art four-transistor, four diode cell VCA. Such an increase in the gainbandwidth product allows the system to be utilized for both audio and video signals.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A signal gain controlled system for impressing a gain on an input signal as a function of a control signal, said system being of the type including: (A) a system input terminal for receiving an input signal and a system output terminal for providing an output signal; (B) first signal converting means for providing a first signal as a function of the logarithm of said input signal, said first signal converting means including (1) an amplifier including (a) an amplifier input terminal coupled to said system input terminal, and (b) an amplifier output terminal, and (2) means disposed in a feedback path between said amplifier input and output terminals and cooperating with said amplifier so as to provide in response to said input signal, a first signal as a function of the logarithm of said input signal; and (C) second signal converting means coupled between the amplifier output terminal and the system output terminal for providing in response to said first signal as a function of the algebraic summation of the first signal and said control signal, wherein the improvement comprises:

amplification means coupled to said amplifier output terminal and responsive to the output of said amplfier for amplifying said first signal as a function of the output signal of said amplifier.

2. A system according to claim 1, wherein said amplification means also generates a biasing current through each of said signal converting means such that said system operates as a Class A device.

3. A system according to claim 2, wherein the sum of the biasing currents through said signal converting means remains substantially constant regardless of the magnitude of voltage level.

4. A system accodring to claim 3, wherein said biasing current generated through each of said signal converting means is at least twice the magnitude of the magnitude of the expected currents through said converting means.

5. A system according to claim 1, wherein said amplification means comprises second and third amplifiers, each being responsive to the the output of said first-mentioned amplifier and respectively connected to the first and second signal converting means of one of said transmission paths so as to respectively generate first and second biasing currents through the corresponding first and second signal converting means of said one transmission path, means for generating a biasing reference signal as a function of said first and second biasing currents, fourth and fifth amplifiers, each being responsive to the biasing reference signal and respectively connected to said first and second signal converting means of the other of said transmission paths so as to respectively generate third and fourth biasing currents through the corresponding first and second signal converting means of the other of said transmission paths.

6. A system according to claim 5, wherein said means for generating said biasing reference signal includes a differential current gain stage.

7. A system according to claim 6, wherein said difference current gain stage is connected to receive a current level substantially equal to the sum of said first, second, third and fourth biasing signals and to provide said biasing reference signal at its output such that said biasing reference signal varies with changes in said input signal such that said current level remains substantially constant.

8. A system according to claim 7, wherein said second and third amplifiers comprise respectively first and second transistors having their bases connected together and coupled to receive a voltage output of said first-mentioned amplifier, said system further comprising a current mirror having a first output connected to generate current through said first and second transistors as a function of said voltage output and a second output connected to the input of said differential current gain stage, and wherein said fourth and fifth amplifiers comprise respectively third and fourth transistors having their bases connected together and to the output of said difference current gain stage, said third and fourth transistors being connected together and to the input of said difference current gain stage.

9. A system according to claim 5, wherein said signal converting means of one transmission path each comprise a primary transistor of a first conductivity type, said signal converting means of the other transmission path each comprise a primary transistor of conductivity type opposite to said first type, and each of said second, third, fourth and fifth amplifiers includes a secondary transistor connected to the corresponding primary transistor and being of a conductivity type opposite to that of said corresponding primary transistor.

10. A system according to claim 1, wherein said system includes a pair of logarithmic-antilogarithmic transmission paths, one path for the portion of each representation of said input signal, each of said transmission paths including means disposed in a respective feedback path between said amplifier input and output terminals and cooperative with said amplifier for providing in response to the corresponding portion of said input signal said first signal as a function of the logarithm of the corresponding portion of said input signal, each of said transmission paths further including a respective one of said second signal converting means coupled between the amplifier output terminal and said system output terminal for providing said output signal in response to the first signal of the transmission path.

* * * * *

UNITED STATES PATENT AND TRADEMARK OFFICE
CERTIFICATE OF CORRECTION

PATENT NO. : 4,331,931
DATED : May 25, 1982
INVENTOR(S) : Robert W. Adams

It is certified that error appears in the above-identified patent and that said Letters Patent are hereby corrected as shown below:

In claim 4, line 2, column 8, "accodring" should read "according".

Signed and Sealed this

Third Day of August 1982

[SEAL]

Attest:

Attesting Officer

GERALD J. MOSSINGHOFF
Commissioner of Patents and Trademarks

UNITED STATES PATENT AND TRADEMARK OFFICE
CERTIFICATE OF CORRECTION

PATENT NO. : 4,331,931
DATED : May 25, 1982
INVENTOR(S) : Robert W. Adams

It is certified that error appears in the above-identified patent and that said Letters Patent are hereby corrected as shown below:

In claim 1, column 8, line 13, after "signal" insert therefor -- ,said output signal at said system output terminal --.

In claim 2, column 8, line 20, after "claim", delete "1" and insert therefor -- 10 --.

In claim 5, column 8, line 33, after "claim", delete "1" and insert therefor -- 10 --.

Signed and Sealed this

Twelfth Day of October 1982

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,331,931

DATED : May 25, 1982

INVENTOR(S) : Robert W. Adams

It is certified that error appears in the above-identified patent and that said Letters Patent is hereby corrected as shown below:

Claim 1, column 7, line 64, delete "controlled" and substitute therefor -- control --.

Claim 1, column 8, lines 17-18, delete "amp-lfier" and substitute therefor -- amplifier --.

Claim 4, column 8, line 28, delete "accodring" and substitute therefor -- according --.

Claim 7, column 8, lines 53-54, delete "differ-ence" and substitute therefor -- differential --.

Claim 8, column 9, line 6, delete "difference" and substitute therefor -- differential --.

Claim 8, column 9, line 8, delete "difference" and substitute therefor -- differential --.

Signed and Sealed this

Eighth Day of November 1983

[SEAL]

Attest:

GERALD J. MOSSINGHOFF

Attesting Officer

Commissioner of Patents and Trademarks